(12) United States Patent
Abe

(10) Patent No.: US 11,588,484 B2
(45) Date of Patent: Feb. 21, 2023

(54) DETECTION DEVICE AND CONTROL DEVICE

(71) Applicant: Alps Alpine Co., Ltd., Tokyo (JP)

(72) Inventor: Keishi Abe, Miyagi-ken (JP)

(73) Assignee: Alps Alpine Co., Ltd.

( * ) Notice: Subject to any disclaimer, the term of this patent is extended or adjusted under 35 U.S.C. 154(b) by 206 days.

(21) Appl. No.: 16/984,319

(22) Filed: Aug. 4, 2020

(65) Prior Publication Data

US 2020/0366290 A1 Nov. 19, 2020

Related U.S. Application Data

(63) Continuation of application No. PCT/JP2018/046838, filed on Dec. 19, 2018.

(30) Foreign Application Priority Data

Mar. 26, 2018 (JP) .............................. JP2018-058675

(51) Int. Cl.
*H03K 17/96* (2006.01)
*H03K 17/955* (2006.01)

(52) U.S. Cl.
CPC ......... *H03K 17/962* (2013.01); *H03K 17/955* (2013.01); *H03K 2217/960765* (2013.01)

(58) Field of Classification Search
CPC .......... G06F 3/00; G06F 3/041; G06F 3/0412; G06F 3/0414; G06F 3/04144; G06F 3/04146; G06F 3/0416; G06F 3/044; G06F 3/042; G06F 3/0445; G06F 3/0446; G06F 3/0447; G06F 2209/00; G06F 2209/502; G06F 1/3287; H01H 2207/016; H01H 2207/01; H01H 2207/04; H01H 2209/00; H01H 2209/024; H01H 2209/038; H03K 17/962; H03K 17/955; H03K 2217/00; H03K 2217/960765
USPC ........................................................ 200/600
See application file for complete search history.

(56) References Cited

U.S. PATENT DOCUMENTS 9,383,867 B2 * 7/2016 Hirakawa ............. G06F 1/3203
10,416,806 B2 9/2019 Koizumi

FOREIGN PATENT DOCUMENTS

WO 2016/046888 A1 3/2016

* cited by examiner

*Primary Examiner* — Anthony R Jimenez
(74) *Attorney, Agent, or Firm* — Harness, Dickey & Pierce, P.L.C.

(57) ABSTRACT

A detection device includes an upper detection electrode, a lower detection electrode disposed under the upper detection electrode in an overlapping manner, a proximity state detection unit configured to detect a proximity state of a detection target relative to a detection surface based on a change in at least one of electrostatic capacitances of the upper detection electrode and the lower detection electrode, and a switching unit configured to perform switching between a first state in which the upper detection electrode and the lower detection electrode are insulated from each other and a second state in which the upper detection electrode and the lower detection electrode are short-circuited to each other.

5 Claims, 6 Drawing Sheets

FIG. 4

| DETECTION MODE | | UPPER ELECTRODE | LOWER ELECTRODE | SHIELD ELECTRODE |
|---|---|---|---|---|
| PROXIMITY DETECTION MODE | | DRIVING BY INSULATION FROM LOWER ELECTRODE | SHORT CIRCUIT TO SHIELD ELECTRODE | DRIVING |
| DISTANCE DETECTION MODE | FIRST DISTANCE DETECTION MODE (DETECTION CAPABILITY: MIDDLE) | SHORT CIRCUIT TO SHIELD ELECTRODE (OR OPEN) | DRIVING BY INSULATION FROM UPPER ELECTRODE | DRIVING |
| | SECOND DISTANCE DETECTION MODE (DETECTION CAPABILITY: HIGH) | DRIVING BY SHORT CIRCUIT TO LOWER ELECTRODE | DRIVING BY SHORT CIRCUIT TO UPPER ELECTRODE | DRIVING |
| | THIRD DISTANCE DETECTION MODE (DETECTION CAPABILITY: HIGH) | DRIVING BY INSULATION FROM LOWER ELECTRODE | DRIVING BY INSULATION FROM UPPER ELECTRODE | DRIVING |

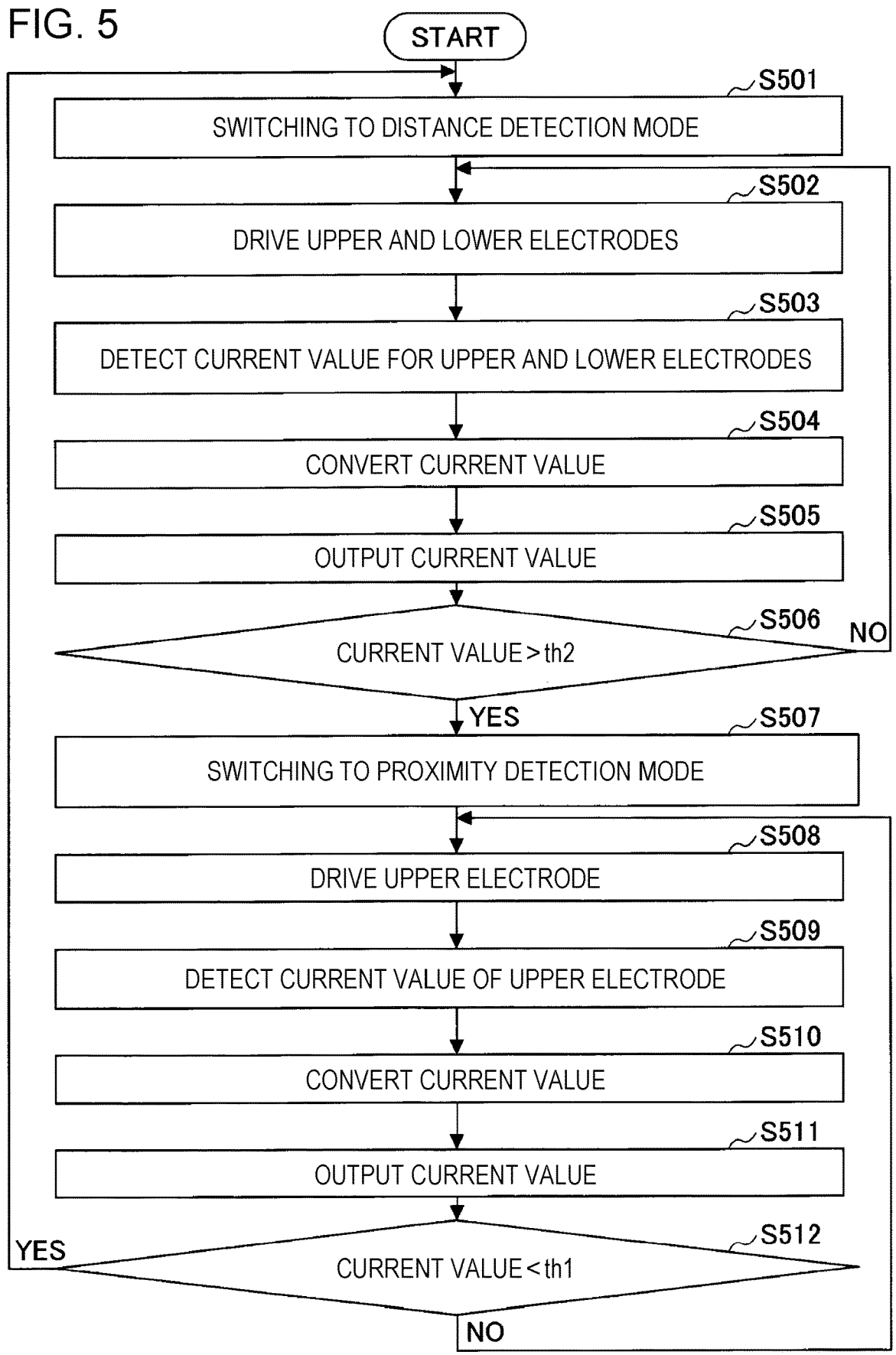

DETECTION DEVICE AND CONTROL DEVICE

CROSS REFERENCE TO RELATED APPLICATIONS

This application is a Continuation of International Application No. PCT/JP2018/046838 filed on Dec. 19, 2018, which claims benefit of Japanese Patent Application No. 2018-058675 filed on Mar. 26, 2018. The entire contents of each application noted above are hereby incorporated by reference.

BACKGROUND OF THE INVENTION

1. Field of the Invention

The present invention relates to a detection device and a control device.

2. Description of the Related Art

In general, detection devices detecting a proximity state of a detection target relative to a detection surface based on a change in an electrostatic capacitance of a detection electrode disposed on the detection surface have been used. Furthermore, in such a detection device, a technique of disposing a shield electrode on a back surface of a detection electrode in an overlapping manner has been used.

For example, Japanese Unexamined Patent Application Publication No. 2017-102811 discloses a technique in which shield electrodes are disposed on back sides of a plurality of detection electrodes, approach or contact of an object on a front surface is detected based on changes in electrostatic capacitances of the shield electrodes and a position of the object is detected based on changes in electrostatic capacitances of the individual detection electrodes in a display device.

Furthermore, Japanese Unexamined Patent Application Publication No. 2015-121958 discloses, in an input device including shield electrodes in lower layers of a plurality of driving electrodes, a technique in which a driving voltage having the same phase as a driving voltage of a corresponding one of the shield electrodes is applied to a selected one of the driving electrodes and a driving voltage having a phase opposite to a phase of the driving voltage of the shield electrode is applied to the other driving electrodes.

SUMMARY OF THE INVENTION

Here, in the general detection devices, since a detection electrode for detecting contact of a detection target on a detection surface (hereinafter referred to as a "contact detection electrode") and a detection electrode for detecting approach of the detection target to the detection surface (hereinafter referred to as a "proximity detection electrode") are different from each other, detection capability is optimized. However, in the general technique, when the contact detection electrode and the proximity detection electrode are disposed in different positions on the same plane, a size of the detection device may be increased. Furthermore, in the general method, when the contact detection element and the proximity detection element overlap with each other, one of the detection electrodes disposed on an upper side may deteriorate detection capability of the other of the detection electrodes disposed on a lower side. Therefore, in such a detection device including a plurality of detection electrodes having different detection purposes, deterioration of detection capability is to be suppressed while increase in size of the detection device is suppressed.

The present invention provides a detection device including an upper detection electrode, a lower detection electrode disposed under the upper detection electrode in an overlapping manner, a proximity state detection unit configured to detect a proximity state of a detection target relative to a detection surface based on a change in at least one of electrostatic capacitances of the upper detection electrode and the lower detection electrode, and a switching unit configured to perform switching between a first state in which the upper detection electrode and the lower detection electrode are insulated from each other and a second state in which the upper detection electrode and the lower detection electrode are short-circuited to each other.

BRIEF DESCRIPTION OF THE DRAWINGS

FIG. 4 is a diagram illustrating detection modes of the control circuit according to the embodiment;

FIG. 5 is a flowchart of a procedure of a process performed by the control circuit according to the embodiment.

DESCRIPTION OF THE PREFERRED EMBODIMENTS

Embodiment

Hereinafter, an embodiment will be described with reference to the accompanying drawings.

Configuration of Detection Device 10

Figure 1:
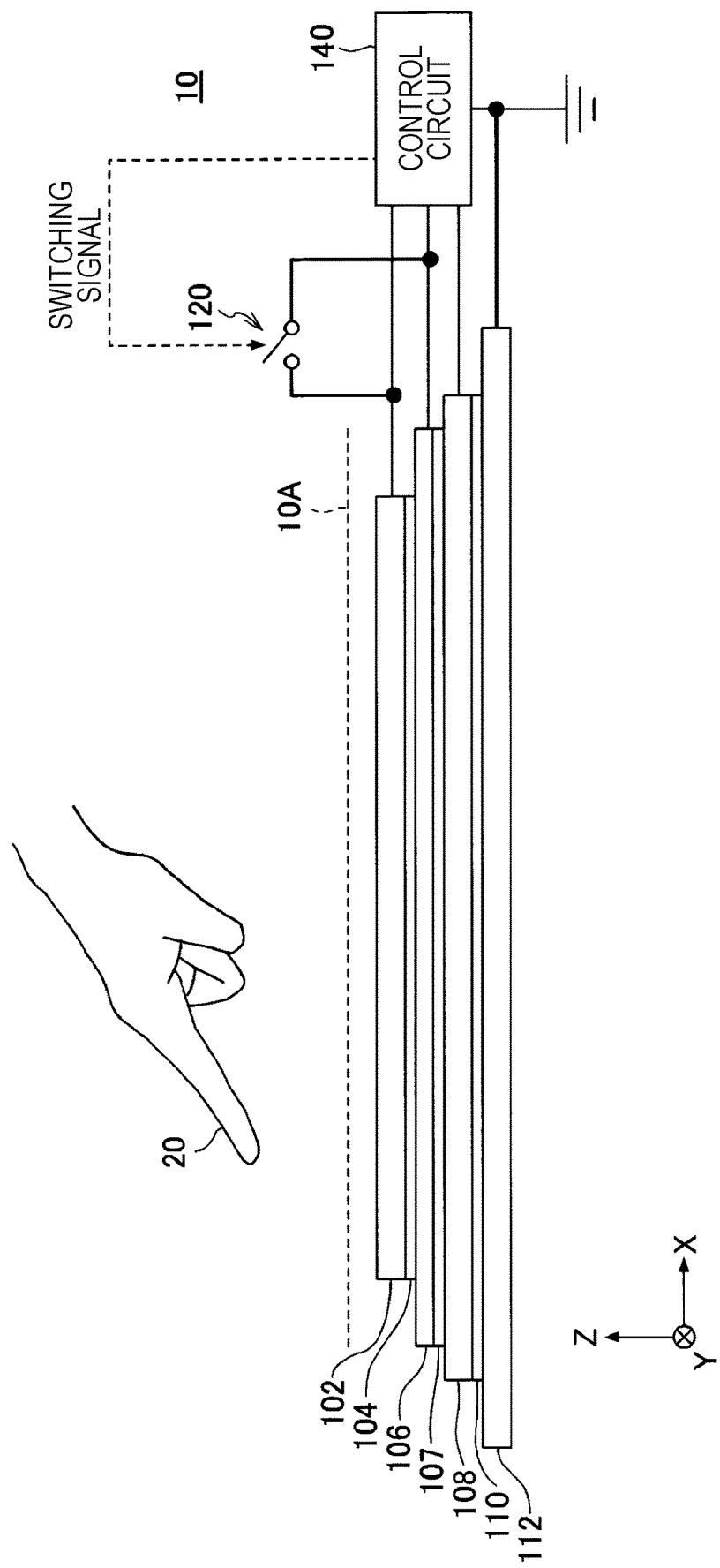
FIG. 1 is a diagram illustrating a configuration of a detection device according to an embodiment.
Figure 2:
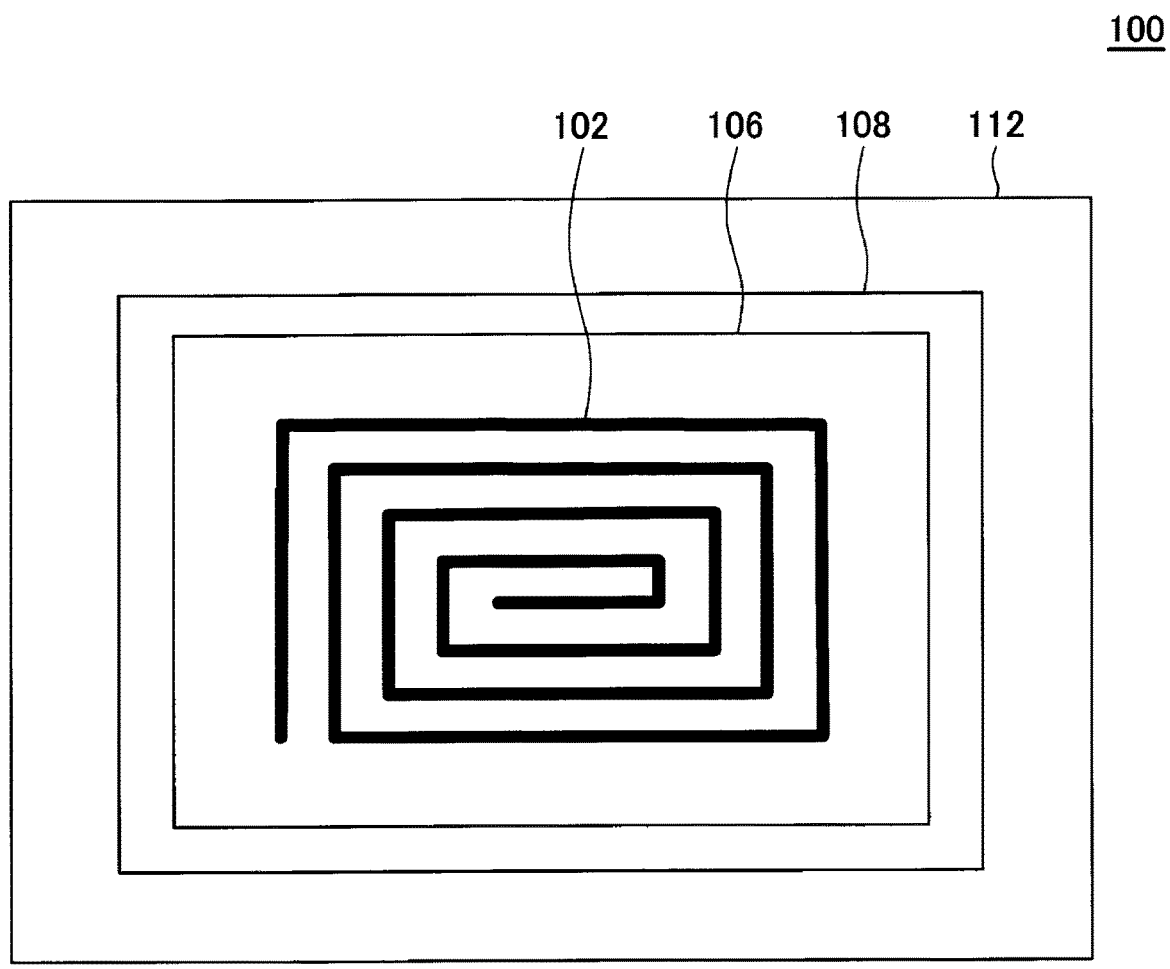
FIG. 2 is a plan view of a detection section included in the detection device according to the embodiment.

FIG. 1 is a diagram illustrating a configuration of a detection device 10 according to the embodiment. FIG. 2 is a plan view of a detection section 100 included in the detection device 10 according to the embodiment. As illustrated in FIGS. 1 and 2, the detection device 10 includes the detection section 100, a switch 120, and a control circuit 140.

The detection section 100 is capable of detecting a proximity state of a detection target 20 (such as a finger) relative to a detection surface 10A. As illustrated in FIGS. 1 and 2, the detection section 100 has a laminated structure configured by laminating a plurality of components. Specifically, the detection section 100 includes an upper detection electrode 102, an insulation layer 104, a lower detection electrode 106, an insulation layer 107, a shield electrode 108, an insulation layer 110, and a ground electrode 112 in this order from the detection surface 10A (a positive side of a Z axis in FIG. 1).

The upper detection electrode 102 is disposed as an uppermost layer of the detection section 100. The lower detection electrode 106 is disposed on a lower side of the upper detection electrode 102 through the insulation layer 104. The upper detection electrode 102 and the lower detection electrode 106 detect a proximity state of the detection target 20 relative to the detection surface 10A. Specifically, the upper detection electrode 102 and the lower detection electrode 106 are driven when the control circuit 140 applies alternating voltage. When an electrostatic capacitance is changed in accordance with a proximity state of the detection target 20, a current value is changed in accordance with the change in the electrostatic capacitance. The current value is detected as a value indicating a proximity state of the detection target 20 by the control circuit 140. As the upper detection electrode 102 and the lower detection electrode 106, a thin film conductor, such as Indium Tin Oxide (ITO), Indium Zinc Oxide (IZO), or a metallic film (such as silver, copper, and a composite of aluminum and molybdenum), is used.

The insulation layer 104 is disposed between the upper detection electrode 102 and the lower detection electrode 106 to insulate the upper detection electrode 102 and the lower detection electrode 106 from each other. Thin film insulation material may be used as the insulation layer 104. For example, an extremely thin resist is applied as the insulation layer 104 in the detection section 100 of this embodiment. By this, the detection section 100 of this embodiment may suppress deterioration of the detection capability of the lower detection electrode 106 using the insulation layer 104.

The insulation layer 107 is disposed between the lower detection electrode 106 and the shield electrode 108 to insulate the lower detection electrode 106 and the shield electrode 108 from each other. Thin plate insulation material or thin film insulation material may be used as the insulation layer 107.

The shield electrode 108 is disposed on a lower side of the lower detection electrode 106 through the insulation layer 107. The shield electrode 108 driven by the control circuit 140 blocks supply of current from the upper detection electrode 102 and the lower detection electrode 106 to the ground electrode 112 so that electrostatic capacitances detectable by the upper detection electrode 102 and the lower detection electrode 106 are increased. A thin plate conductor or a thin film conductor may be used as the shield electrode 108.

The insulation layer 110 is disposed between the shield electrode 108 and the ground electrode 112 so as to insulate the shield electrode 108 and the ground electrode 112 from each other. Thin plate insulation material or thin film insulation material may be used as the insulation layer 110.

The ground electrode 112 is disposed as a lowermost layer of the detection section 100. The ground electrode 112 is grounded. A thin plate conductor or a thin film conductor may be used as the ground electrode 112.

The switch 120 is electrically connected to the upper detection electrode 102 and the lower detection electrode 106. The switch 120 is turned on by a switching signal supplied from the control circuit 140 so that a second state in which the upper detection electrode 102 and the lower detection electrode 106 are short-circuited to each other may be entered. On the other hand, the switch 120 is turned off by a switching signal supplied from the control circuit 140 so that a first state in which the upper detection electrode 102 and the lower detection electrode 106 are insulated from each other may be entered.

The control circuit 140 is an example of a "control device". The control circuit 140 is electrically connected to the upper detection electrode 102, the lower detection electrode 106, and the shield electrode 108. The control circuit 140 may detect a proximity state of the detection target 20 relative to the detection surface 10A based on a change in an electrostatic capacitance of at least one of the upper detection electrode 102 and the lower detection electrode 106.

Furthermore, the control circuit 140 controls the switch 120 so as to perform switching between the first state in which the upper detection electrode 102 and the lower detection electrode 106 are insulated from each other and the second state in which the upper detection electrode 102 and the lower detection electrode 106 are short-circuited to each other. Furthermore, the control circuit 140 may selectively perform switching among a driving state, an open state (non-driving state), and a state of short-circuit with the shield electrode 108 for each of the upper detection electrode 102 and the lower detection electrode 106. An integrated circuit (IC), for example, is used as the control circuit 140.

Plane Configuration of Detection Section 100

FIG. 2 is a plan view of a detection section 100 included in the detection device 10 according to the embodiment. As illustrated in FIG. 2, in a plan view from the above (the positive direction of the Z axis in FIG. 2), the lower detection electrode 106 has a detection area larger than that of the upper detection electrode 102 and includes a detection range of the upper detection electrode 102. Specifically, a portion of a detection surface of the lower detection electrode 106 is covered by the upper detection electrode 102.

Although the detection section 100 includes a spiral band conductor as the upper detection electrode 102 in the example of FIG. 2, the number of upper detection electrodes 102 and a shape of the upper detection electrode 102 are not limited to these. For example, a plurality of rectangle conductors may be disposed as the upper detection electrode 102 on the detection section 100 in the same plane similarly to the lower detection electrode 106. Furthermore, the detection section 100 may have a configuration the same as that of a touch panel employing an electrostatic capacitance method (such as a configuration in which a plurality of detection electrodes are arranged in a matrix), for example, so as to detect a contact position of the detection target 20 on the detection surface 10A.

Furthermore, in the example of FIG. 2, although a single rectangle conductor is disposed as the lower detection electrode 106 in the detection section 100, the number of lower detection electrodes 106 and a shape of the lower detection electrode 106 are not limited to these. For example, in the detection section 100, a plurality of conductors may be disposed as the lower detection electrodes 106 on the same plane.

Functional Configuration of Control Circuit 140

Figure 3:
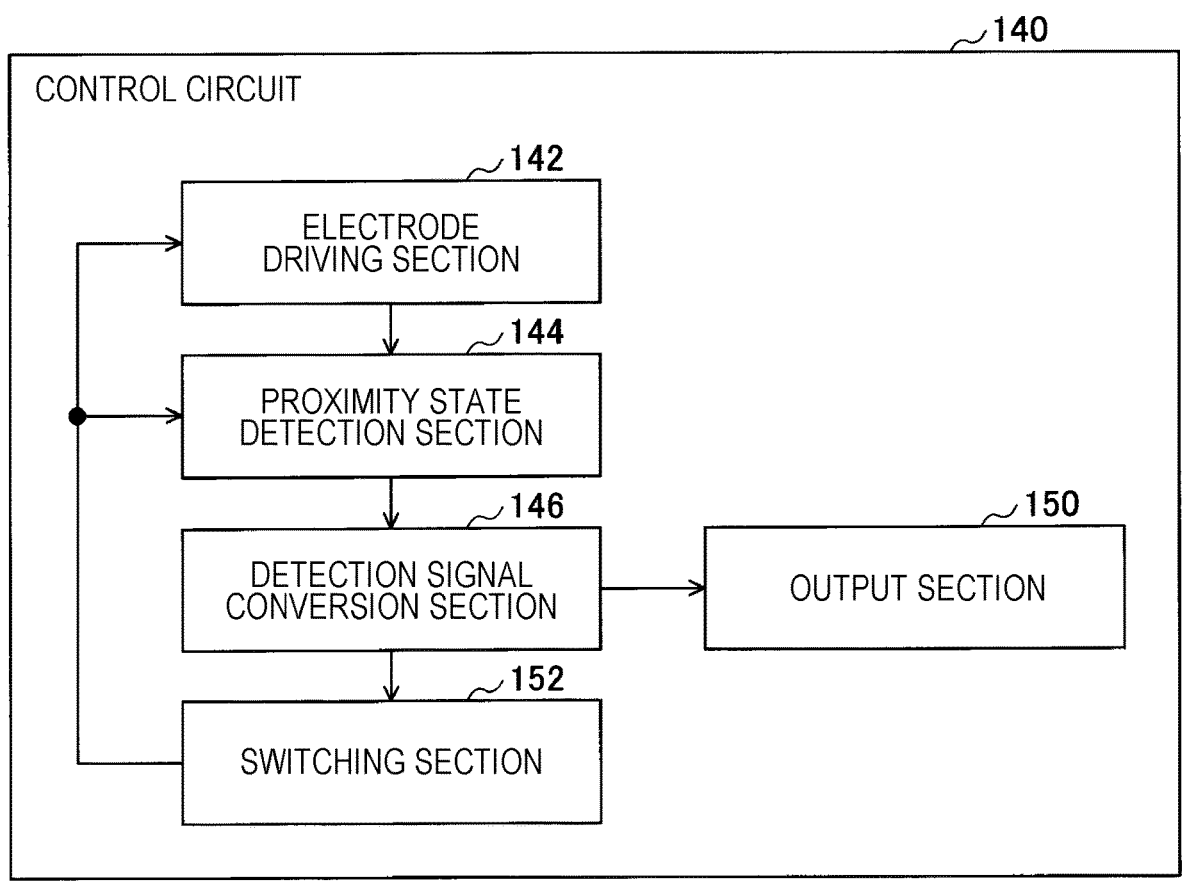
FIG. 3 is a block diagram illustrating a functional configuration of a control circuit according to the embodiment.

FIG. 3 is a block diagram illustrating a functional configuration of the control circuit 140 according to the embodiment. As illustrated in FIG. 3, the control circuit 140 includes an electrode driving section 142, a proximity state detection section 144, a detection signal conversion section 146, an output section 150, and a switching section 152.

The electrode driving section 142 drives the upper detection electrode 102, the lower detection electrode 106, and the shield electrode 108. Specifically, the electrode driving section 142 drives at least one of the upper detection electrode 102 and the lower detection electrode 106 in accordance with a detection mode of the control circuit 140 and further drives the shield electrode 108. Note that electrodes to be driven by the electrode driving section 142 will be described hereinafter with reference to FIG. 4 for each detection mode. Furthermore, the electrode driving section 142 drives the shield electrode 108 by a driving voltage having the same phase as driving voltages of the upper detection electrode 102 and the lower detection electrode 106.

The proximity state detection section 144 is an example of a "proximity state detection unit". The proximity state detection section 144 detects a current value of an electrode driven by the electrode driving section 142 as a value indicating a proximity state of the detection target 20. Specifically, the proximity state detection section 144 detects a current value of an electrode driven by the electrode driving section 142 (at least one of the upper detection electrode 102 and the lower detection electrode 106) in accordance with a detection mode of the control circuit 140. Note that, when the proximity state of the detection target 20 is changed, an electrostatic capacitance of the electrode driven by the electrode driving section 142 is changed, and accordingly, the current value is changed. Therefore, the current value detected by the proximity state detection section 144 indicates a proximity state of the detection target 20.

The detection signal conversion section 146 performs a predetermined conversion process on a current value (analog signal) detected by the proximity state detection section 144. For example, the detection signal conversion section 146 performs an analog/digital conversion process on a current value detected by the proximity state detection section 144 as the predetermined conversion process. Note that the detection signal conversion section 146 may perform a process of converting a current value detected by the proximity state detection section 144 into a value of another unit indicating a proximity state of the detection target 20 (such as a proximity distance).

The output section 150 outputs a current value detected by the proximity state detection section 144 (a current value subjected to the conversion process performed by the detection signal conversion section 146) to an external information processing apparatus as a value indicating a proximity state of the detection target 20. Note that the output section 150 may output a detection mode of the control circuit 140 when the current value is detected, in addition to the current value detected by the proximity state detection section 144, to the external information processing apparatus. By this, the external information processing apparatus may perform a process corresponding to a detection mode of the control circuit 140, for example.

The switching section 152 is an example of a "switching unit". The switching section 152 switches a detection mode of the control circuit 140 based on a current value detected by the proximity state detection section 144 (that is, an electrostatic capacitance value of an electrode driven by the electrode driving section 142). Specifically, the switching section 152 may change the detection mode of the control circuit 140 in accordance with the proximity state of the detection target 20 on the detection surface 10A.

For example, when the current value detected by the proximity state detection section 144 is smaller than a predetermined first threshold value th1 in a "proximity detection mode" described below (an example of a first detection mode), the switching section 152 changes the detection mode of the control circuit 140 into a "second distance detection mode" (an example of a "second detection mode") described below. By this, the switching section 152 may perform switching to the "second distance detection mode" when the detection target 20 is positioned far away from the detection surface 10A by a predetermined distance in the "proximity detection mode". Note that a preferred value corresponding to a detection distance for the switching of a detection mode is stored in a memory in advance as the first threshold value th1, for example. Furthermore, the first threshold value th1 may be changed by the external information processing apparatus, for example.

Furthermore, when the current value detected by the proximity state detection section 144 is larger than a predetermined second threshold value th2 (that is, the detection target 20 is not far away from the detection surface 10A by the predetermined distance) in the "second distance detection mode", for example, the switching section 152 switches the detection mode of the control circuit 140 into the "proximity detection mode". Note that a preferred value corresponding to a detection distance for the switching of a detection mode is stored in the memory in advance as the second threshold value th2, for example. Furthermore, the second threshold value th2 may be changed by the external information processing apparatus, for example. Moreover, the second threshold value th2 may be the same as the first threshold value th1 or may be different from the first threshold value th1.

Detection Mode of Control Circuit 140

FIG. 4 is a diagram illustrating a detection mode of the control circuit 140 according to the embodiment. As illustrated in FIG. 4, the control circuit 140 has the "proximity detection mode" and the "distance detection mode" as the detection modes.

The "proximity detection mode" is an example of a "first detection mode". The "proximity detection mode" is preferably used to detect the detection target 20 when the detection target 20 is positioned relatively close to the detection surface 10A. For example, the "proximity detection mode" is preferably used to detect contact of the detection target 20 on the detection surface 10A. In the "proximity detection mode", the upper detection electrode 102 and the shield electrode 108 are driven in a state in which the upper detection electrode 102 and the lower detection electrode 106 are insulated from each other, and a proximity state of the detection target 20 is detected based on a change in an electrostatic capacitance of the upper detection electrode 102. Note that the lower detection electrode 106 is short-circuited to the shield electrode 108 under control of the control circuit 140 in the "proximity detection mode". By this, the lower detection electrode 106 may function as a portion of the shield electrode 108 so that capability of blocking of flow of current from the upper detection electrode 102 to the ground electrode 112 may be enhanced.

The "distance detection mode" is preferably used to detect the detection target 20 when the detection target 20 is positioned relatively far from the detection surface 10A. For example, the "distance detection mode" is preferably used to detect a noncontact operation (such as a gesture operation) of the detection target 20 on the detection surface 10A. The "distance detection mode" include a "first distance detection mode", the "second distance detection mode", and a "third distance detection mode".

The "first distance detection mode" is an example of a "fourth detection mode". The "first distance detection mode" has "middle" detection capability. In the "first distance detection mode", the lower detection electrode 106 and the shield electrode 108 are driven in a state in which the upper detection electrode 102 and the lower detection electrode 106 are insulated from each other and the upper detection electrode 102 is short-circuited to the shield electrode 108 (or an open state), and a proximity state of the detection target 20 is detected based on a change in the electrostatic capacitance of the lower detection electrode 106.

The "second distance mode" is an example of a "second detection mode". The "second distance detection mode" has "large" detection capability. In the "second distance detection mode", the upper detection electrode 102, the lower detection electrode 106, and the shield electrode 108 are driven in a state in which the upper detection electrode 102 and the lower detection electrode 106 are short-circuited to each other, and a proximity state of the detection target 20 is detected based on a change in an electrostatic capacitance of the upper detection electrode 102 and the lower detection electrode 106 which are short-circuited to each other.

The "third distance detection mode" is an example of a "third detection mode". The "third distance detection mode" has "large" detection capability. In the "third distance detection mode", the upper detection electrode 102, the lower detection electrode 106, and the shield electrode 108 are driven in a state in which the upper detection electrode 102 and the lower detection electrode 106 are insulated from each other, and a proximity state of the detection target 20 is detected based on a change in an electrostatic capacitance of the upper detection electrode 102 and a change in an electrostatic capacitance of the lower detection electrode 106.

In the detection section 100 of this embodiment, since the upper detection electrode 102 overlaps on the lower detection electrode 106, a detection area of the lower detection electrode 106 is reduced due to an area of the upper detection electrode 102, and therefore, detection capability of the lower detection electrode 106 may be deteriorated. Therefore, the detection section 100 of this embodiment uses the electrostatic capacitance value of the upper detection electrode 102 in addition to the electrostatic capacitance value of the lower detection electrode 106 in the "second distance detection mode" and the "third distance detection mode", so that the deterioration of the detection capability described above may be compensated for by the electrostatic capacitance value of the upper detection electrode 102. Specifically, a proximity state of the detection target 20 may be detected as if the upper detection electrode 102 does not overlap on the lower detection electrode 106. Accordingly, the detection section 100 of this embodiment may detect a proximity state of the detection target 20 with high accuracy even when the detection target 20 is positioned relatively far from the detection surface 10A.

Note that, in the "second distance detection mode", a proximity state of the detection target 20 is detected by combining the upper detection electrode 102 and the lower detection electrode 106 in terms of hardware. Specifically, in the "second distance detection mode", a circuit configuration in which the upper detection electrode 102 and the lower detection electrode 106 are combined in terms of hardware (such as the switch 120) is disposed in the detection device 10. Specifically, the electrode driving section 142 drives the upper detection electrode 102 and the lower detection electrode 106 which are short-circuited to each other as a single detection electrode. Then the proximity state detection section 144 detects a current value of the single detection electrode detected by the proximity state detection section 144 as a value indicating a proximity state of the detection target 20.

On the other hand, the "third distance detection mode" detects a proximity state of the detection target 20 by combining the electrostatic capacitance value of the upper detection electrode 102 and the electrostatic capacitance value of the lower detection electrode 106 in terms of software. Specifically, in the "third distance detection mode", a processing program of combining an electrostatic capacitance value of the upper detection electrode 102 and an electrostatic capacitance value of the lower detection electrode 106 is installed in the control circuit 140. Specifically, the electrode driving section 142 drives both the upper detection electrode 102 and the lower detection electrode 106. Then the proximity state detection section 144 calculates a total value of a current value of the upper detection electrode 102 and a current value of the lower detection electrode 106 as a value indicating a proximity state of the detection target 20.

For example, when the detection device 10 is converted into a commercial reality, the "second distance detection mode" or the "third distance detection mode" may be usable in accordance with a use purpose, cost restriction, size restriction, or the like. Alternatively, both the "second distance detection mode" and the "third distance detection mode" may be available and the user may arbitrarily select one of the modes. Furthermore, both the "second distance detection mode" and the "third distance detection mode" may be available and the "second distance detection mode" and the "third distance detection mode" may be dynamically switched from one to another in accordance with a processing program based on a predetermined switching condition.

Furthermore, although the "first distance detection mode" has detection capability lower than those of the "second distance detection mode" and the "third distance detection mode", the "first distance detection mode" is provided in addition to the "second distance detection mode" and the "third distance detection mode" since power consumption of the "first distance detection mode" is smaller than those of the "second distance detection mode" and the "third distance detection mode" and the user may arbitrarily select one of the modes.

Procedure of Process by Control Circuit 140

FIG. 5 is a flowchart of a procedure of a process performed by the control circuit 140 according to the embodiment. Note that, although the "second distance detection mode" is used as the "distance detection mode" in this embodiment, other detection modes may be used.

First, the switching section 152 switches a detection mode of the control circuit 140 into the "distance detection mode" (step S501). Specifically, the switching section 152 turns on the switch 120 so that the upper detection electrode 102 and the lower detection electrode 106 are short-circuited to each other.

Subsequently, the electrode driving section 142 drives the upper detection electrode 102 and the lower detection electrode 106 which are short-circuited to each other (step S502). The proximity state detection section 144 detects a current value indicating a proximity state of the detection target 20 relative to the detection surface 10A as a change in an electrostatic capacitance of the upper detection electrode 102 and the lower detection electrode 106 driven in step S502 (step S503). Furthermore, the detection signal conversion section 146 performs a predetermined conversion process on the current value detected in step S503 (step S504). Moreover, the output section 150 outputs the current value detected in step S503 to the external information processing apparatus (step S505).

Thereafter, the switching section 152 determines whether the current value detected in step S503 is larger than the predetermined second threshold value th2 (step S506).

When it is determined that the current value detected in step S503 is not larger than the predetermined second threshold value th2 in step S506 (step S506: No), the control circuit 140 returns to step S502.

On the other hand, when it is determined that the current value detected in step S503 is larger than the predetermined second threshold value th2 in step S506 (step S506: Yes), the switching section 152 switches the detection mode of the control circuit 140 into the "proximity detection mode" (step S507). Specifically, the switching section 152 turns off the switch 120 so that the upper detection electrode 102 and the lower detection electrode 106 are insulated from each other.

Subsequently, the electrode driving section 142 drives the upper detection electrode 102 (step S508). Then the proximity state detection section 144 detects a current value indicating a proximity state of the detection target 20 relative to the detection surface 10A as a change in an electrostatic capacitance of the upper detection electrode 102 driven in step S508 (step S509). Furthermore, the detection signal conversion section 146 performs a predetermined conversion process on the current value detected in step S509 (step S510). Moreover, the output section 150 outputs the current value detected in step S509 to the external information processing apparatus (step S511).

Then the switching section 152 determines whether the current value detected in step S509 is smaller than the predetermined first threshold value th1 (step S512).

When it is determined that the current value detected in step S509 is not smaller than the predetermined first threshold value th1 in step S512 (step S512: No), the control circuit 140 returns to step S508.

On the other hand, when it is determined that the current value detected in step S510 is smaller than the predetermined first threshold value th1 in step S512 (step S512: Yes), the control circuit 140 returns to step S501.

According to the series of processes illustrated in FIG. 5, the operation mode of the control circuit 140 is alternately switched between the "distance detection mode" and the "proximity detection mode" in accordance with the proximity state of the detection target 20.

Method for Correcting Current Value

Figure 6:
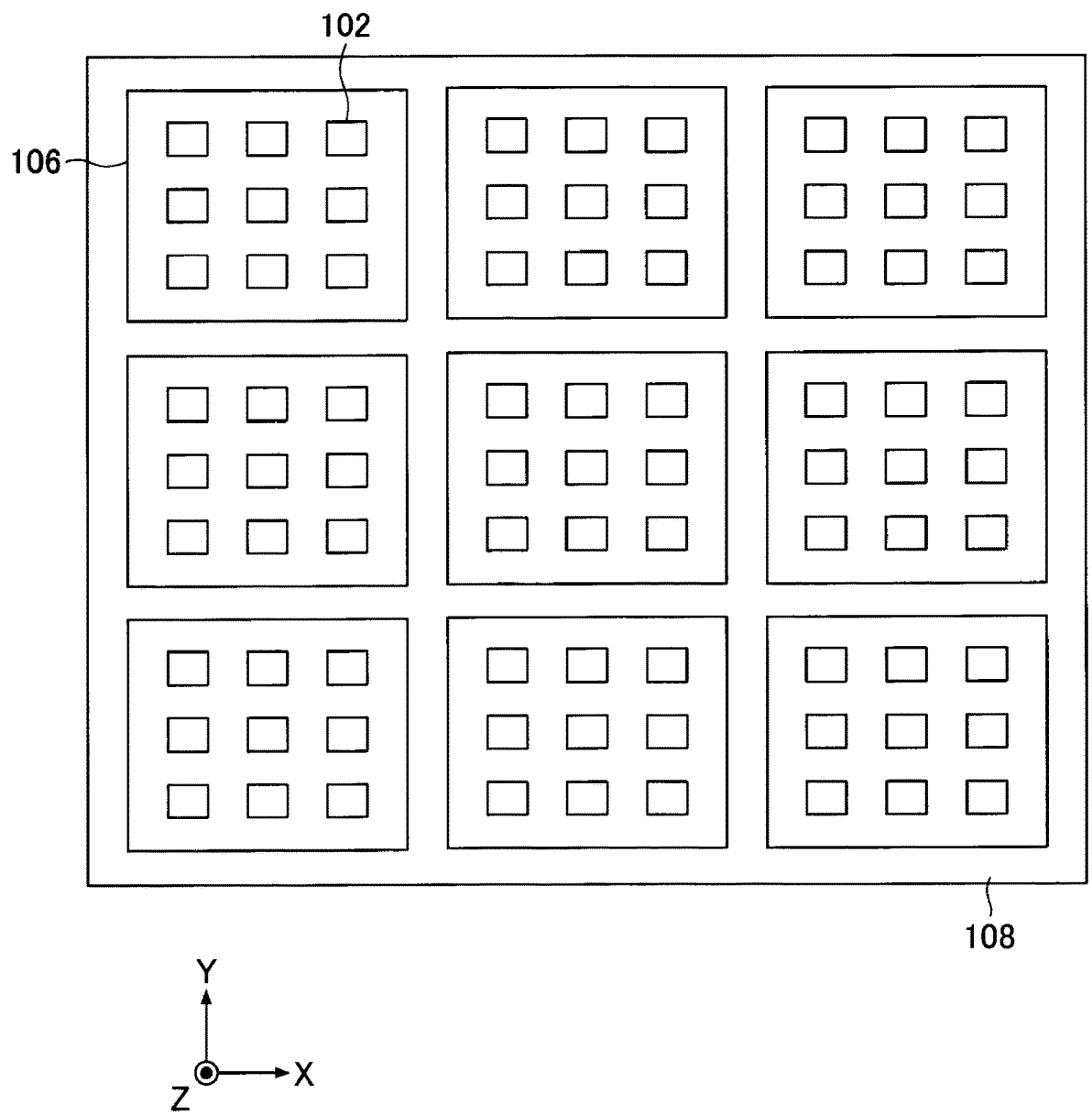
FIG. 6 is a diagram illustrating a method for correcting detection sensitivity of the control circuit according to the embodiment.

FIG. 6 is a diagram illustrating a method for correcting a current value employed in the control circuit 140 according to the embodiment. In FIG. 6, a plane configuration of the detection section 100 is illustrated. Note that the insulation layer 104, the insulation layer 107, the insulation layer 110, and the ground electrode 112 are omitted in FIG. 6 for simplicity of the description. Furthermore, in FIG. 6, the numbers of the upper detection electrodes 102 and the lower detection electrodes 106 and shapes of the upper detection electrode 102 and the lower detection electrode 106 are different from those of FIG. 2.

In the example of FIG. 6, a plurality of rectangle lower detection electrodes 106 are arranged in a matrix such that the lower detection electrodes 106 overlap on the shield electrode 108. Furthermore, a plurality of rectangle upper detection electrodes 102 are arranged in a matrix on the plurality of lower detection electrode 106 such that the upper detection electrodes 102 overlap on the lower detection electrodes 106.

In the example of FIG. 6, a contact position of the detection target 20 relative to the detection surface 10A is detected in accordance with changes in electrostatic capacitances of the plurality of upper detection electrodes 102 in the "proximity detection mode" described above. Furthermore, in the example of FIG. 6, a distance of the detection target 20 from the detection surface 10A is detected by changes in electrostatic capacitances of the plurality of upper detection electrodes 102 and the plurality of lower detection electrodes 106 which are short-circuited to each other in the "second distance detection mode" described above.

Here, the inventors of the present invention realizes that detection sensitivity of a detection electrode is substantially proportional to a detection area of the detection electrode through experiment. Accordingly, a current value in the "second distance detection mode" (that is, a current value of the upper detection electrode 102 and the lower detection electrode 106 which are short-circuited to each other) is ideally equal to a current value of the single lower detection electrode 106 (that is, the upper detection electrode 102 does not overlap on the lower detection electrode 106).

Therefore, the control circuit 140 may correct the current value of the upper detection electrode 102 and the lower detection electrode 106 which are short-circuited to each other in the "second distance detection mode" to an ideal value.

For example, a current value of the single lower detection electrode 106 is measured as a measurement value 1. Then a current value of the upper detection electrode 102 and the lower detection electrode 106 which are short-circuited to each other is measured as a measurement value 2 under a measurement condition the same as that employed when the measurement value 1 is measured. When the measurement value 2 is equal to the measurement value 1, the correction is not required. On the other hand, when the measurement value 2 is smaller than the measurement value 1, a correction coefficient is calculated in accordance with Expression (1).

$$\text{Correction Coefficient} = \text{Measurement Value 1}/\text{Measurement Value 2} \quad (1)$$

When the measurement value 1 is "100" and the measurement value 2 is "80", for example, a correction coefficient is "1.25". In this case, correction is performed such that the measurement value 2 becomes "100" using the correction coefficient "1.25".

As a first correction method, the control circuit 140 multiplies a current value detected by the proximity state detection section 144 by the correction coefficient "1.25". By this, the current value may be corrected to an ideal value.

As a second correction method, the control circuit 140 multiplies a setting value of detection sensitivity of the upper detection electrode 102 and the lower detection electrode 106 by the correction coefficient "1.25". By this, the current value detected by the proximity state detection section 144 may be corrected to an ideal value.

As described above, the detection device 10 according to this embodiment includes the upper detection electrode 102, the lower detection electrode 106 disposed under the upper detection electrode 102 in an overlapping manner, the proximity state detection section 144 detecting a proximity state of the detection target 20 relative to the detection surface 10A based on at least one of changes in electrostatic capacitances of the upper detection electrode 102 and the lower detection electrode 106, and the switching section 152 capable of performing switching between the first state in which the upper detection electrode 102 and the lower detection electrode 106 are insulated from each other and the second state in which the upper detection electrode 102 and the lower detection electrode 106 are short-circuited to each other. Accordingly, the detection device 10 of this embodiment may compensate for reduction of the detection area of the lower detection electrode 106 using the upper detection electrode 102 by short-circuiting the upper detection electrode 102 and the lower detection electrode 106 to each other. In particular, according to the detection device 10 of this embodiment, increase in size of the detection device 10 may be suppressed since the upper detection electrode 102 and the lower detection electrode 106 are disposed in an overlapping manner. Therefore, according to the detection device 10 of this embodiment, detection capability of the detection device 10 of this embodiment including different detection electrodes of different detection purposes may be suppressed while increase in size of the detection device 10 is suppressed.

Although the embodiment of the present invention is described in detail hereinabove, the present invention is not limited to such embodiments and may be modified or changed within the scope of the present invention disclosed in claims.

For example, some of the functions of the control circuit 140 may be included in the external information processing apparatus installed outside the control circuit 140.

Furthermore, although the upper detection electrode 102 and the lower detection electrode 106 are short-circuited to each other by the switch 120 disposed outside the control circuit 140, a similar switch may be incorporated in the control circuit 140 so as to cause the upper detection electrode 102 and the lower detection electrode 106 to be short-circuited to each other using the switch.

Furthermore, in the foregoing embodiment, the control circuit 140 may further include a determination section determining a proximity state of the detection target 20 relative to the detection surface 10A based on a current value detected by the proximity state detection section 144.

For example, the determination section may determine whether the detection target 20 has approached the detection surface 10A based on a current value detected by the proximity state detection section 144. In this case, the determination section may determine whether the detection target 20 has approached the detection surface 10A based on a current value detected by the proximity state detection section 144 and a predetermined threshold value.

Furthermore, the determination section may determine a proximity distance of the detection target 20 relative to the detection surface 10A based on a current value detected by the proximity state detection section 144. In this case, the determination section may determine a proximity distance of the detection target 20 relative to the detection surface 10A based on a current value detected by the proximity state detection section 144 and a predetermined conversion equation or a predetermined conversion table.

Furthermore, when the determination section is disposed, the output section 150 may output a result of the determination performed by the determination section to the external information processing apparatus.

What is claimed is:

1. A detection device comprising:
an upper detection electrode;
a lower detection electrode disposed under the upper detection electrode in an overlapping manner;
a proximity state detection unit configured to detect a proximity state of a detection target relative to a detection surface based on a change in at least one of electrostatic capacitances of the upper detection electrode and the lower detection electrode;
a switching unit configured to perform switching between a first state in which the upper detection electrode and the lower detection electrode are insulated from each other and a second state in which the upper detection electrode and the lower detection electrode are short-circuited to each other; and
a shield electrode disposed under the lower detection electrode in an overlapping manner,
wherein the detection device has a first detection mode and a second detection mode,
wherein, in the first detection mode,
the switching unit
switches the upper detection electrode and the lower detection electrode to the first state, and
the proximity state detection unit
detects a proximity state of the detection target based on a change in an electrostatic capacitance of the upper detection electrode,
wherein, in the second detection mode,
the switching unit
switches the upper detection electrode and the lower detection electrode to the second state, and
the proximity state detection unit
detects a proximity state of the detection target based on a change in an electrostatic capacitance of the upper detection electrode and the lower detection electrode, and
wherein the switching unit
causes the lower detection electrode to function as a portion of the shield electrode by short-circuiting the shield electrode and the lower detection electrode in the first detection mode.

2. The detection device according to claim 1,
wherein the switching unit
switches the first detection mode to the second detection mode when a current value of the upper detection electrode is smaller than a predetermined first threshold value, and
switches the second detection mode to the first detection mode when a current value of the upper detection electrode and the lower detection electrode is larger than a predetermined second threshold value.

3. The detection device according claim 1,
wherein the shield electrode is driven by a driving voltage having the same phase as a driving voltage of the upper detection electrode.

4. A detection device comprising:
an upper detection electrode;
a lower detection electrode disposed under the upper detection electrode in an overlapping manner;
a proximity state detection unit configured to detect a proximity state of a detection target relative to a detection surface based on a change in at least one of electrostatic capacitances of the upper detection electrode and the lower detection electrode; and
a switching unit configured to perform switching between a first state in which the upper detection electrode and the lower detection electrode arte insulated from each other and a second state in which the upper detection electrode and the lower detection electrode are short-circuited to each other;
wherein the detection device has a first detection mode, a second detection mode and a third detection mode,
wherein, in the first detection mode,
the switching unit
switches the upper detection electrode and the lower detection electrode to the first state, and
the proximity state detection unit
detects a proximity state of the detection target based on a change in an electrostatic capacitance of the upper detection electrode,
wherein, in the second detection mode,
the switching unit switches the upper detection electrode and the lower detection electrode to the second state, and
the proximity state detection unit
detects a proximity state of the detection target based on a change in an electrostatic capacitance of the upper detection electrode and the lower detection electrode, and
wherein, in the third detection mode,
the switching unit
switches the upper detection electrode and the lower detection electrode to the first state, and
the proximity state detection unit
detects a proximity state of the detection target based on a change in an electrostatic capacitance of the upper detection electrode and a change in an electrostatic capacitance of the lower detection electrode.

5. A detection device comprising:
an upper detection electrode;
a lower detection electrode disposed under the upper detection electrode in an overlapping manner;
a proximity state detection unit configured to detect a proximity state of a detection target relative to a detection surface based on a change in at least one of electrostatic capacitances of the upper detection electrode and the lower detection electrode; and
a switching unit configured to perform switching between a first state in which the upper detection electrode and the lower detection electrode arte insulated from each other and a second state in which the upper detection electrode and the lower detection electrode are short-circuited to each other;
wherein the detection device has a first detection mode, a second detection mode and a fourth detection mode,
wherein, in the first detection mode,
the switching unit
switches the upper detection electrode and the lower detection electrode to the first state, and
the proximity state detection unit
detects a proximity state of the detection target based on a change in an electrostatic capacitance of the upper detection electrode,
wherein, in the second detection mode,
the switching unit
switches the upper detection electrode and the lower detection electrode to the second state, and
the proximity state detection unit
detects a proximity state of the detection target based on a change in an electrostatic capacitance of the upper detection electrode and the lower detection electrode, and
wherein, in the fourth detection mode,
the switching unit
switches the upper detection electrode and the lower detection electrode to the first state, and
the proximity state detection unit
detects a proximity state of the detection target based on a change in an electrostatic capacitance of the lower detection electrode.

* * * * *